US007957178B2

(12) United States Patent
Houston

(10) Patent No.: US 7,957,178 B2
(45) Date of Patent: Jun. 7, 2011

(54) STORAGE CELL HAVING BUFFER CIRCUIT FOR DRIVING THE BITLINE

(75) Inventor: Theodore Warren Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/209,418

(22) Filed: Sep. 12, 2008

(65) Prior Publication Data

US 2009/0175069 A1    Jul. 9, 2009

Related U.S. Application Data

(60) Provisional application No. 61/019,024, filed on Jan. 4, 2008, provisional application No. 61/019,028, filed on Jan. 4, 2008, provisional application No. 61/019,020, filed on Jan. 4, 2008.

(51) Int. Cl.
*G11C 11/00* (2006.01)
*G11C 7/10* (2006.01)
*G11C 8/00* (2006.01)

(52) U.S. Cl. .................. 365/154; 365/156; 365/189.04; 365/230.05

(58) Field of Classification Search .................. 365/154
See application file for complete search history.

(56) References Cited

U.S. PATENT DOCUMENTS

| | | | | |
|---|---|---|---|---|
| 5,353,251 A * | 10/1994 | Uratani et al. | ............ | 365/189.05 |
| 5,469,380 A * | 11/1995 | Iio | ................................ | 365/154 |
| 5,475,638 A * | 12/1995 | Anami et al. | ............ | 365/189.11 |
| 5,572,469 A * | 11/1996 | Anami et al. | ............ | 365/189.11 |
| 6,011,726 A * | 1/2000 | Batson et al. | ................. | 365/188 |
| 6,212,094 B1 * | 4/2001 | Rimondi | ........................ | 365/156 |
| 6,717,841 B2 * | 4/2004 | Tsukikawa | .................... | 365/154 |
| 7,164,596 B1 | 1/2007 | Deng et al. | | |
| 7,385,840 B2 * | 6/2008 | Redwine | ....................... | 365/154 |
| 7,460,408 B2 * | 12/2008 | Yabe | ........................ | 365/185.23 |
| 2003/0026150 A1 * | 2/2003 | Rimondi | ........................ | 365/203 |
| 2004/0114422 A1 * | 6/2004 | Yabe | ............................. | 365/154 |
| 2007/0025162 A1 * | 2/2007 | Deng et al. | ............. | 365/189.09 |
| 2007/0127286 A1 * | 6/2007 | Yabe | ............................. | 365/154 |
| 2007/0279966 A1 | 12/2007 | Houston | | |

OTHER PUBLICATIONS

Ted Houston et al., U.S. Appl. No. 12/209,456, "Memory Cell Layout Structure with Outer Bitline," filed Sep. 12, 2008.
Ted Houston, U.S. Appl. No. 12/209,657, "Dual Node Access Storage Cell Having Buffer Circuits," filed Sep. 12, 2008.
Ted Houston, U.S. Appl. No. 11/962,713, "Seven Transistor SRAM Cell," filed Dec. 21, 2007.

* cited by examiner

*Primary Examiner* — Son L Mai
(74) *Attorney, Agent, or Firm* — Rose Alyssa Keagy; Wade J. Brady, III; Frederick J. Telecky, Jr.

(57) ABSTRACT

An integrated circuit includes a memory array including a plurality of memory cells, the memory cells include a core storage element having at least a first storage node (S) and a complementary second storage node (S-bar), and a first pass gate coupled to the first storage node (S). A single bitline (BL) is coupled to a node in a source drain path of the first pass gate. The BL is for Reading data from and Writing data to the first storage node (S). A buffer circuit includes a second pass gate and a driver transistor, wherein the second pass gate is coupled between the driver transistor and the source drain path of the first pass gate. A gate of the driver transistor is coupled to the second storage node (S-bar). At least one wordline (WL) is coupled to the first pass gate and the second pass gate.

23 Claims, 10 Drawing Sheets

STORAGE CELL HAVING BUFFER CIRCUIT FOR DRIVING THE BITLINE

CROSS REFERENCE TO RELATED APPLICATION

This application claims the benefit of Provisional Application Ser. No. 61/019,024 entitled "10T SRAM Cell with 1 WL and 2 BL's (BL and BL_)", filed Jan. 4, 2008, Provisional Application Ser. No. 61/019,028 entitled: "7T SRAM CELL WITH 1 WL AND 1 BL", filed Jan. 4, 2008, and Provisional Application Ser. No. 61/019,020 entitled: "METHOD FOR ACCELERATING MONTE CARLO EVALUATIONS, AND CIRCUITS DESIGNED BY THIS METHOD", filed Jan. 4, 2008 which are all herein incorporated by reference in their entireties.

FIELD OF INVENTION

The present invention relates generally to semiconductor memory devices and more particularly to integrated circuits having memory cells that include read buffer circuitry.

BACKGROUND

The basic CMOS 6T SRAM cell generally includes two n-type or n-channel (NMOS) pull-down or drive transistors and two p-type (PMOS) pull-up or load transistors in a cross-coupled inverter configuration, with two additional NMOS select or pass-gate transistors added to make up a standard double-sided or differential six-transistor memory cell (a DS 6T SRAM cell, a 6T SRAM cell, or simply a 6T cell). A 5 transistor SRAM cell (5T) use a single pass gate transistor, and a 7T cell comprises a 5T cell together with a "read buffer" coupled to the 5T cell which comprises a series connected read pass transistor and a read driver transistor.

There is a general need for a stable compact memory cell with high Read current (Iread) per area, that operates at low power (e.g. low quiescent supply current (IDDQ), that is stable during a Read operation and can be reliably Written. However, these characteristics generally contradict one another. For example, low Vt and/or short gate lengths generally provide high Iread, but also result in high subthreshold leakage and poor cell stability. Longer channel lengths and/or higher voltage thresholds (Vt) reduce subthreshold leakage and improve cell stability but degrade Iread, especially at low VDD. Similarly, changes in the transistors (such as width, length, or threshold voltage) that improve the cell stability during a Read generally degrade the robustness of the Write.

An 8T SRAM cell comprising a 6T core SRAM cell and a read buffer with separate read wordline (WL) and separate read bitline (BL) has been proposed to separate read functionality from write functionality. However, this separation of read functionality and write functionality of the conventional 8T is not effective in conventional SRAM architectures where words are interleaved in a row. Cells that are in a selected row but not a selected column (half selected cells) are subject to upset during a Write cycle. This upset of half selected cells can be remedied by Read and Write back, but additional peripheral circuitry is needed to sense the read bit lines (RBL) and drive the write bit lines (WBL) for half selected cells in a Write cycle.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

An integrated circuit includes at least one memory cell, wherein the memory cell comprises a core storage element having at least a first storage node, and a first pass gate coupled to the first storage node. A single bitline (BL) is coupled to a node in a source drain path of the first pass gate. The same BL is for both reading data from and writing data to the first storage node. As used herein, memory cells having "a single bitline (BL)" refers to memory cells having only one BL per cell, and thus excludes memory cell arrangements that couple a first BL to the first storage node of the cell and a second BL to the second storage node of the cell. Memory cells having "a single bitline (BL)" according to embodiments of the invention implement a single-sided Write operation, as opposed to differential Write where a first BL is coupled to a first storage node of the cell and a second BL is coupled to the second storage node of the cell.

The core storage element includes a complementary second storage node, or alternatively the memory cell includes inversion circuitry for outputting an inverted voltage relative to a voltage at the first storage node. A buffer circuit comprises a second pass gate and a driver transistor, where the second pass gate and the driver transistor are coupled to the source drain path of the first pass gate, and where the second pass gate is coupled between the driver transistor and the single BL. A gate of the driver transistor is coupled to the second storage node or the output of the inversion circuitry. At least one wordline (WL) is coupled to the first pass gate and the second pass gate.

The core storage element can comprise a 4T DRAM (2T core), or an SRAM, or in the case of the inversion circuitry embodiment, single storage node core cells, such as FeRAM and MRAM and 1T DRAM. In one embodiment, the first and second pass gates are connected in series between the core storage element and the driver transistor, and the single BL is coupled between the first and second pass gates. In another embodiment, the first and second pass gates are connected in series between the storage element and the single BL, and the first pass gate is coupled between the driver and the core storage element.

DETAILED DESCRIPTION

Figure 1A:
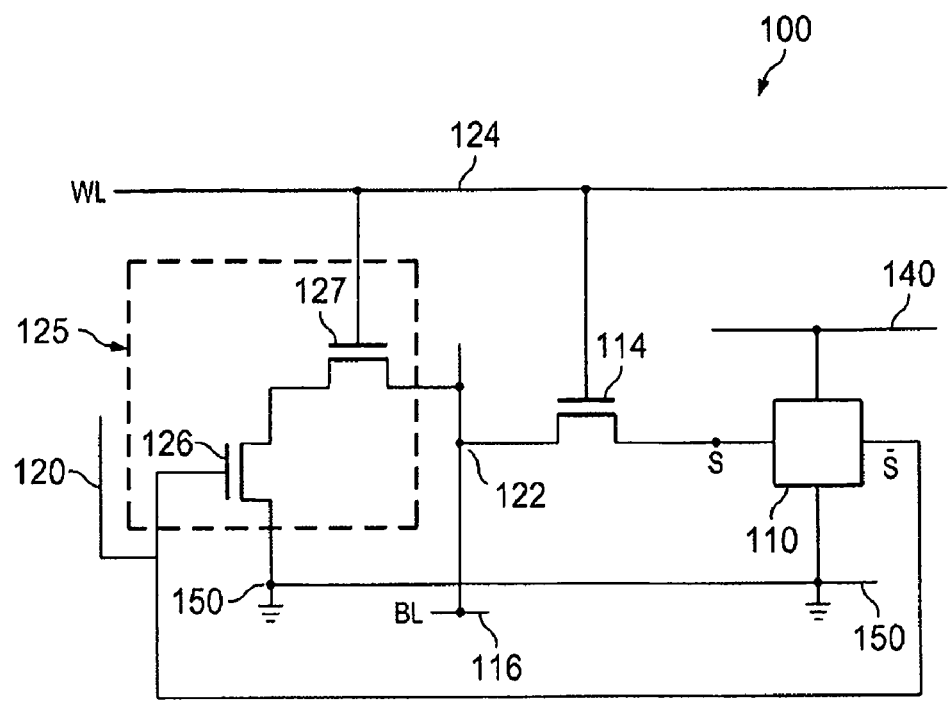
FIG. 1A is a schematic of a memory cell comprising a core storage element and a buffer circuit comprising a pass gate and a driver, with a single Read/Write BL and a Read/Write WL, according to an embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention include a new memory cell having a buffer circuit comprising a pass gate and a driver coupled to a core storage element for driving the BL. Embodiments of the invention are generally applicable to core storage elements that have complementary first and second storage nodes (S, S-bar), such as SRAMs and 4T-DRAMs (comprising a 2T core and a pair of pass gates), or in embodiments where the memory cell includes inversion circuitry, embodiments of the invention are also applicable to core storage elements that have only a single storage node. The driver is gated by the inverse of the voltage on the first storage node that is reflected on the second storage node or provided by the inversion circuitry coupled to the first storage node S.

FIG. 1A is a schematic of a memory cell 100 with a single Read/Write BL and a Read/Write WL, according to an embodiment of the invention. Memory cell 100 includes a core storage element 110 which provides a first storage node (S), and a complementary second storage node (S-bar). Memory cell 100 is connected to a VDD drain voltage line 140 and a VSS source voltage line 150 shown as ground. A first pass gate 114 is coupled to the first storage node S.

A buffer circuit 125 comprises a second pass gate 127 and a driver transistor 126, wherein the second pass gate 127 is coupled between the driver transistor 126 and the source drain path of the first pass gate 114. A gate of the driver transistor 126 is coupled to the second storage node S-bar. A wordline (WL) 124 is shown coupled to both the first pass gate 114 and the second pass gate 127.

In a typical embodiment, the combination of second pass gate 127 and the driver transistor 126 may be considered to be a read buffer for core storage element I 10. The second pass gate 127 may function as a read pass gate, while driver transistor 126 may function as a read driver. Driver 126 and pass gate 127 in combination are operable to supply current to the BL 116 in parallel with current supplied by the core storage element 110 through pass gate 114. Thus, the buffer circuit 125 assists in driving the BL 116 and reduces the probability of upset of the memory cell 100 when the memory cell 100 is accessed.

A single Read/Write BL, shown as BL 116, is coupled to a source drain path of the first pass gate 114 (and storage node S when first pass gate 114 is on), and is thus generally operable for both Reading and Writing data to the first storage node S. No BL is coupled to the second storage node S-bar. As shown in FIG. 1A, BL 116 is coupled to the node identified as node 122, which is at a source/drain of second pass gate 127 and a source/drain of first pass gate 114. It is noted that the source and drain of a pass gate interchange according to the bias, and are thus different for Read vs Write. In either Read or Write, for a given bias condition the two nodes referred to would both be sources or both be drains. A Read/Write WL 124 is shown coupled to the gate of the first pass gate 114 and to the gate of the second pass gate 127. However, as described below, embodiments of the invention also can include separate read and write WLs.

The coupling of pass gate 127 (and thus buffer circuit 125) to the same BL 116 coupled to the first pass gate 114 in memory cell 100, and thus to the first storage node S, provides a significant stability improvement over conventional memory cells which provide no such connection. A stability improvement results from buffer 125 in this configuration being able to help discharge BL 116 for read operations and for half selected cells during Write operations. This faster discharge of BL 116 improves the dynamic stability of the memory cell 100.

In operation of cell 100 for Read, with the single Read/Write BL 116 precharged high and WL 124 asserted high, when the first storage node S is low (and the second storage node S-bar is high) the buffer 125 helps pull the associated BL 116 low, thus reducing the probability of upset. In this case, it can be seen that BL 116 is pulled low (toward ground in FIG. 1A) through read driver 126 and pass gate 127 which are both on when the second storage node S-bar and WL 124 are high, respectively, and thus couples the BL 116 to VSS source voltage line 150 (shown at ground). This discharge path through the buffer circuit 125 is in addition to the conventional BL discharge path which is through first pass gate 114 and a pull-down transistor in the storage element 110. If the pass gate 127 has lower Vt relative to the Vt of the first pass gate 114, as WL 124 ramps up, the buffer circuit 125 will start discharging the BL 116 before the pass gate 114 is turned on sufficiently for BL 116 to upset the core storage element 110. In either case, the BL 116 will discharge faster with the addition of the buffer circuit 125 vs. conventional cell designs, thus adding stability to the memory cell 100 as compared to convention cell designs that lack coupling of the buffer 125 to the same BL 116 that is coupled to the first storage node S.

Figure 1B:
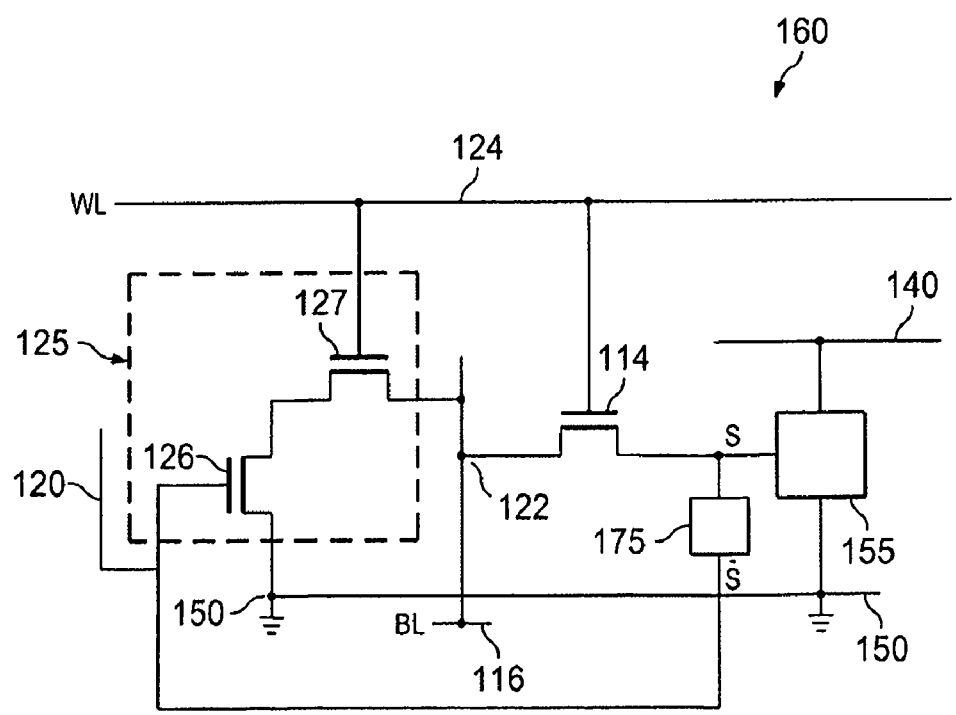
FIG. 1B is a schematic of a memory cell comprising a single storage node core storage element and a buffer circuit comprising a pass gate and a driver, with a single Read/Write BL and a Read/Write WL, and inversion circuitry for outputting an inverted voltage relative to a voltage at the first storage node, according to an embodiment of the invention.

Although the second storage node, S-bar, is generally shown herein gating the driver, such as for cell 100 shown in FIG. 1A, in other embodiments of the invention inversion circuitry provides this inverse voltage without the need for a second storage node. FIG. 1B is a schematic of a memory cell 160 according to an embodiment of the invention comprising a single storage node core storage element 155, a buffer circuit 125 comprising a pass gate 127 and a driver 126, with a single Read/Write BL 116 and a Read/Write WL 124. Memory cell 160 also includes inversion circuitry 175, such as a conventional inverter, for outputting an inverted voltage relative to a voltage at the first storage node S. The inverted output, S-bar, is coupled to the gate of driver 126. This embodiment allows embodiments of the invention to be applied to core storage elements that provide only a single storage node, such as FeRAM and MRAM and 1T DRAM.

Embodiments of the invention thus generally solve the need for a memory cell that provides compactness, high Read current per area, and low power (e.g. low IDDQ). Embodiments of the invention also generally provide enhanced stability by taking advantage of dynamic effects for stability as described above.

In one embodiment of the invention, an integrated circuit comprises one or more memory arrays comprising a plurality of memory cells according to embodiments of the invention. In one embodiment, the memory cell comprises a 7T SRAM cell, which comprises a 5T SRAM core cell (a 4T core SRAM element and a single pass gate for single sided Read and single sided Write) and a two (2) transistor buffer circuit having an output coupled to the single pass gate. In another embodiment, the memory cell comprises a 4T DRAM element.

The single BL is provided for both Reading and Writing data to the storage node S. In one embodiment of the invention, the memory cell can have a single wordline (WL) for both Read/Write instead of the separate Read/Write WL's of conventional memory cells with read buffers. In other embodiments of the invention, a low voltage power supply (e.g. VSS) for the buffer circuit can be separate from the low voltage supply coupled to the core storage element and thus provide a different supply voltage level as compared to the corresponding low power supply level that is provided to the core storage element. In particular, the low voltage supply to the buffer can be floated in Standby to reduce leakage, and can be floated to the addressed (fully selected) cells in a Write operation to avoid contention with the buffer circuit functioning as a write driver. Optionally, the VSS to the buffer circuits of the addressed cells in a Write cycle can be raised or lowered according to the data being written.

Figure 2A:
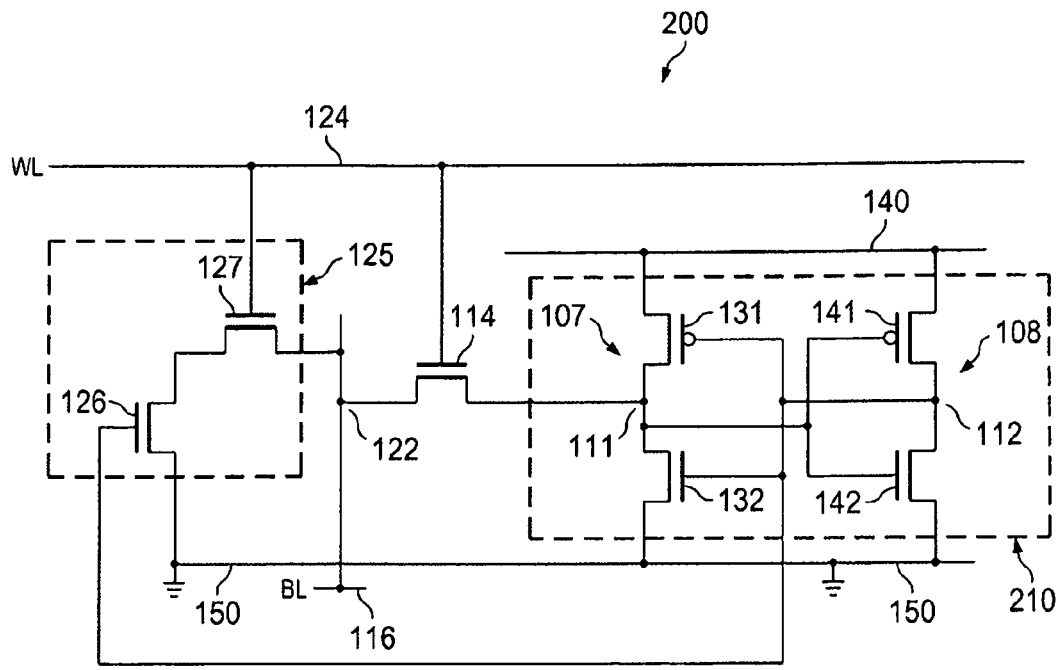
FIG. 2A is a schematic of a 7T SRAM memory cell with a single Read/Write BL, and a Read/Write WL, according to an embodiment of the invention.

FIG. 2A is a schematic of a 7T SRAM cell 200 with a single Read/Write BL and Read/Write WL, according to an embodiment of the invention. Memory cell 200 includes a 4T core storage element 210 which comprises conventional first and second cross-coupled inverters 107, 108. Respective inverters 107 and 108 comprise a p-type MOS (PMOS) pull-up or load transistor 131, 141 and an n-type (NMOS) pull-down transistor 132, 142. The first inverter 107 has a first storage (latched data) node 111 and the second inverter has a second storage node 112. Inverters 107 and 108 of the SRAM core 110 are connected together to a VDD drain voltage line 140 and as VSS source voltage line 150. A first pass gate 114 is coupled to the first storage node 111.

As described above relative to FIGS. 1A and 1B, the buffer circuit 125 which comprises second pass gate 127 and series connected driver transistor 126 is coupled to the BL 116 at node 122, and the single BL 116 is connected to storage node 111 by first pass gate 114. The combination of 4T core cell 210 and first pass transistor can be referred to as a 5T core storage element 210, 114. The gate of the driver 126 is shown coupled to the second storage node 112.

The coupling of the buffer circuit 125 to the same BL 116 as to which storage node 111 is connected (via first pass transistor 114) in the 7T memory cell 200, provides a significant stability improvement over conventional 7T cells which provide no such connection. The stability improvement results from the buffer circuit 125 in this configuration being able to help discharge the single BL 116 for read operations. This faster discharge of BL 116 improves the dynamic stability of the cell 200.

In operation of cell 200 for Read, with the Read/Write BL 116 precharged high and WL 124 asserted high, when the first storage node 111 is low (and second storage node 112 is high) the buffer circuit 125 helps pull the associated BL 116 low, thus reducing the probability of upset. In this case, it can be seen that BL 116 is pulled low (toward ground in FIG. 2A) through driver 126 and pass gate 127 which are both on when storage node 112 and WL 124 are high, respectively, and thus couples the BL 11.6 to VSS source voltage line 150 (at ground). This discharge path through the buffer circuit 125 is in addition to the conventional BL discharge path which is through first pass transistor 114 and NMOS pull-down transistor 132. If the pass transistor 127 has lower Vt relative to the Vt of the first pass gate 114, as WL 124 ramps up, the buffer circuit 125 will start discharging the BL 116 before the pass gate 114 is turned on sufficiently for BL 116 to upset the cell 200. In either case, the BL 116 will discharge faster with the addition of the buffer circuit 125 vs. conventional cell designs that do not have a buffer circuit connected to the same BL as that to which the storage node 111 is connected, thus adding stability to cell 200 as compared to convention cell designs that lack coupling of the buffer circuit 125 to the BL 116.

As noted above, this stability enhancement provided by the buffer circuit 125 will generally be more effective if the pass gate 127 of the buffer circuit 125 has a lower Vt as compared to the Vt of the pass gate 114 associated with the core 210, such as at least 0.02 V, at least 0.03 V, or at least 0.05 V. As used herein, differences in voltage thresholds expressed as higher or lower Vts, refer to thresholds for the respective devices in the memory cell averaged across the corresponding devices in an array of such cells, thus averaging out random variation. In the design and the fabrication, for example, the target threshold adjust implant dose for pass gate 127 may be lower than the target threshold adjust implant dose for pass gate 114 so that the nominal Vt for pass gates 127 in the memory array is lower as compared to the nominal Vt of the pass gates 114 in the memory array.

Moreover, as described below relative to FIG. 4A where separate WLs are provided, having a slower rise time or delayed signal applied to the gate of pass gate 114 as compared to the signal applied to the gate of the pass gate 127 will also generally improve stability. The improved stability results from allowing more time for the buffer circuit 125 to pull down the BL 116 before the pass gate 114 is turned on sufficiently to possibly upset the cell.

For Write operations, BL 116 is driven (by a write driver, not shown) to force the desired state of the cell when WL 124 is asserted. Optionally, to enhance Write robustness, BL 116 can be precharged high, and WL 124 turned on to establish a low on BL 116 for half-selected cells storing a '0'; and then boost WL 124 for Write into the selected cells with the established voltage on BL 116 on the half-selected cells, thus avoiding upset. It is noted that with the improved dynamic stability provided by the buffer circuit 125 driving the read/write BL 116, the design of the 5T core 210,114 can be slanted more toward improved Write (e.g. relatively stronger (e.g. wider or shorter gate length) write pass gates) compared to a stand-alone 5T. Moreover, as described below relative to FIG. 2B, by having separate power supplies for the core cells 210 in the array and the buffer circuit 125, Write robustness can also generally be improved as compared to a single VSS supply, such as reducing the potential for buffer circuit contention problems during Write operations.

Figure 2B:
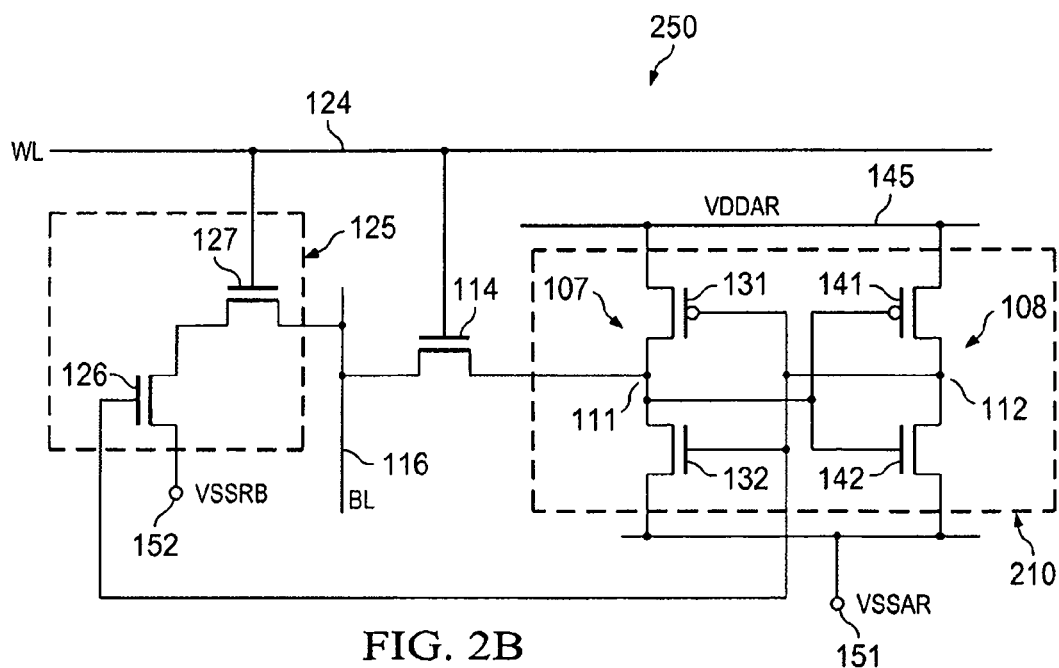
FIG. 2B is a schematic of a 7T SRAM memory cell with a single Read/Write BL and a Read/Write WL, having separate power supplies for the core storage element and the buffer circuit, according to an embodiment of the invention.
Figure 2C:
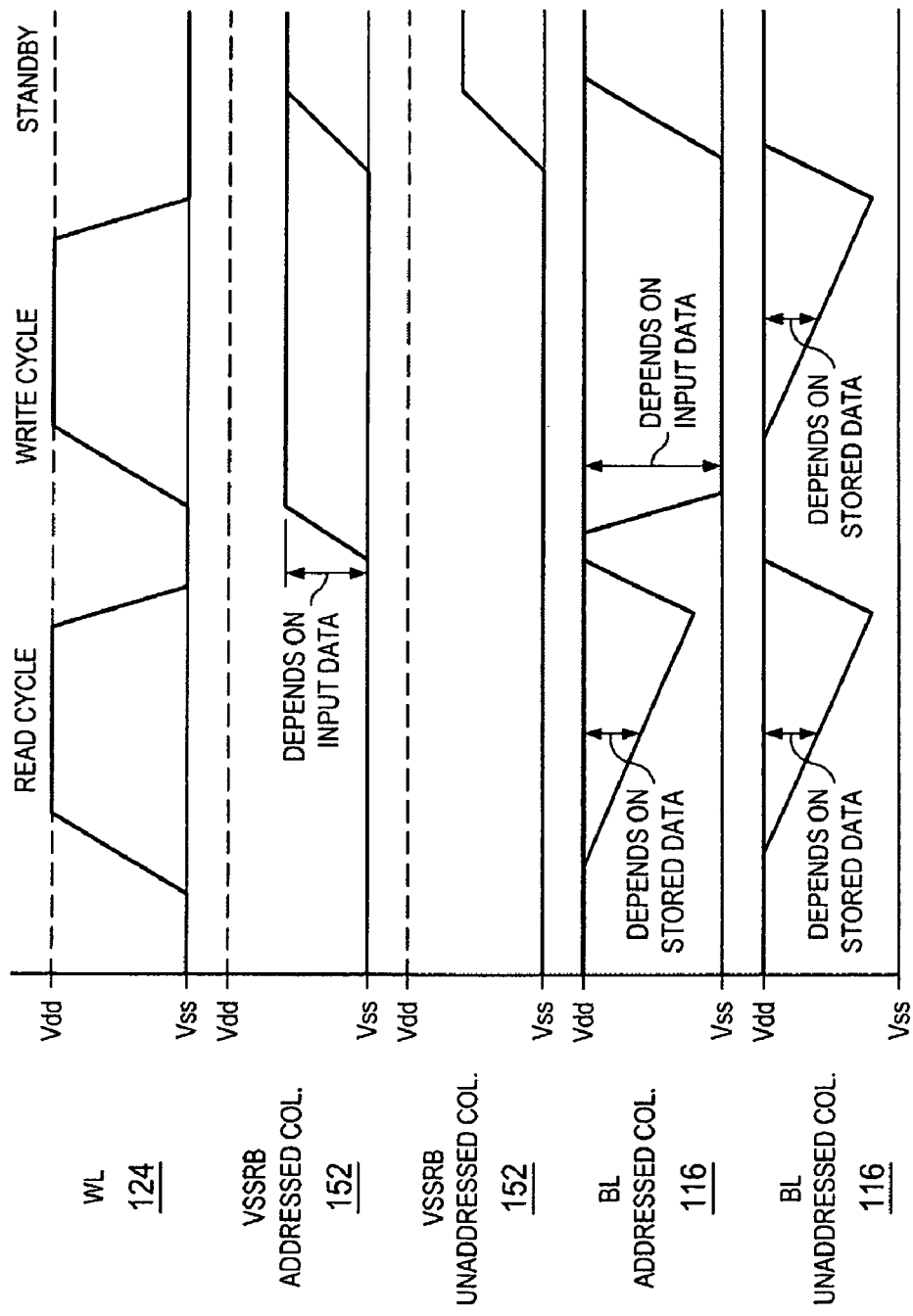
FIG. 2C is a timing diagram showing the operation of a memory cell such as shown in FIG. 2B through a Read cycle, a Write cycle and a Standby cycle.

FIG. 2B is a schematic of a 7T memory cell 250 with a single Read/Write BL 116 and Read/Write WL 124, having separate VSS power supplies for the core storage element array (VSSAR 151) and the buffer circuit 125 (VSSRB 152), according to an embodiment of the invention. FIG. 2C is a timing diagram showing the operation of memory cell 250 through a Read cycle, a Write cycle and a Standby cycle. During a Read cycle, the voltage on BL 116 for both addressed columns and unaddressed columns may be lowered, depending on the stored data. During a Write cycle, VSSRB 152 can be floated and allowed to rise above VSS in columns being written (addressed columns) to reduce possible contentions with the buffer circuit 125. VSSRB 152 is shown kept low (at VSS) for unaddressed columns in Write to help the stability of the half addressed cells in the array. While in Standby, for low IDDQ (low power) operation, VSSRB 152 can be floated as shown.

Cell 250 can be operated at lower power by raising (more positive) VSSAR 151 while in active mode. This will also generally improve Vtrip and thus the Write margin, with little or no degradation of stability (SNM). A possible down side to raising VSSAR 151 is that the read driver 126 may not be fully turned off on the '0' side. Nevertheless, there will generally still be a strong differential between read current and leakage current. An alternative is to lower the VDD for the array, shown as VDDAR 145, but this can cause a greater degradation of SNM, and also reduce Iread.

In one embodiment of the invention, a more robust Write operation can be achieved by using two or more different voltage levels on the WL during a Write operation. For example, during a Write operation the Read/Write WL 124 shown in FIGS. 2A and 2B can transition initially to a first voltage level and later during the Write operation transition to a second voltage level that is a higher as compared to the first voltage level. Boosting the WL voltage in the Write cycle after some delay time allows an initial establishment of a voltage on the BL's 116 of the half addressed cells which can improve the stability of the half selected cells in the array while the delayed boost of the WL 124 can lead to a more robust Write.

Figure 2D:
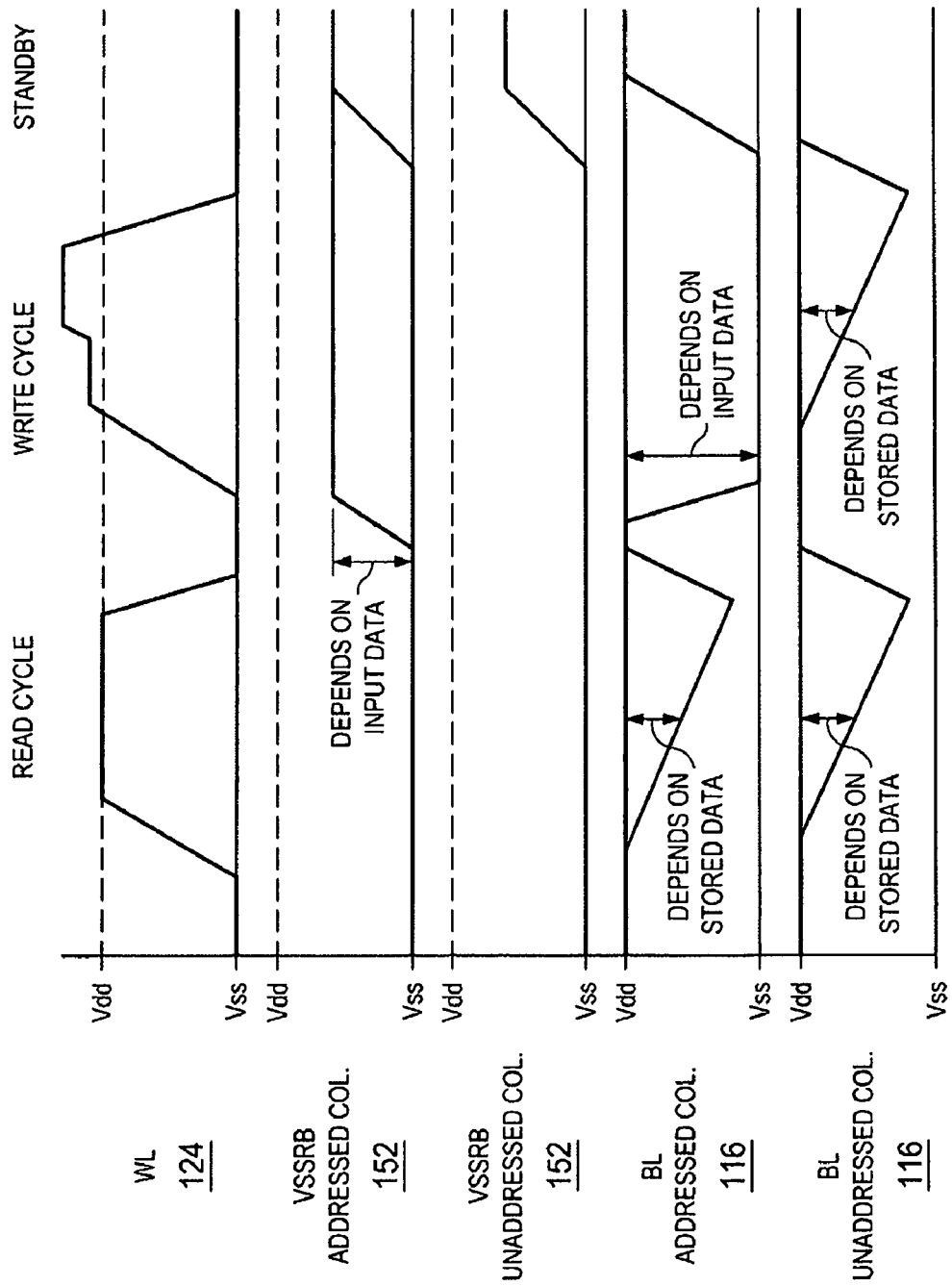
FIG. 2D is a timing diagram showing the operation of a memory cell such as shown in FIG. 2B through a Read cycle, a Write cycle and a Standby cycle, according to a first embodiment that realizes a delayed boosted WL level during a Write operation.

FIG. 2D is a timing diagram showing the operation of a memory cell, such as cell 250, through a Read cycle, a Write cycle and a Standby cycle, in a first embodiment that realizes a delayed boosted WL level during a Write operation. During the Write operation shown, the WL 124 initially rises to VDD, then after a delay sufficient for the establishment of a stable voltage on the BL's 116 of the half addressed cells, WL 124 rises to a level above VDD.

Figure 2E:
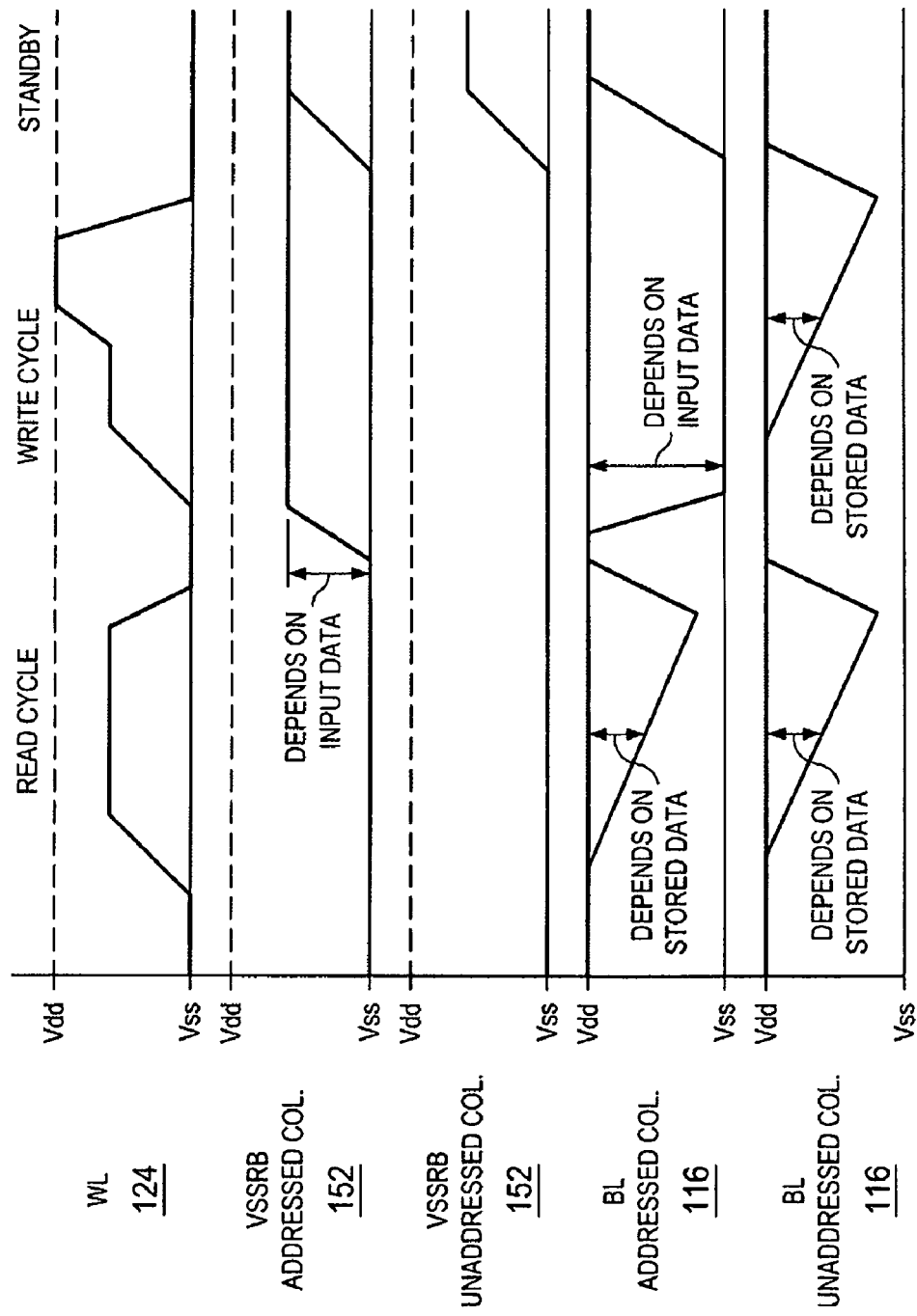
FIG. 2E is a timing diagram showing the operation of a memory cell such as shown in FIG. 2B through a Read cycle, a Write cycle and a Standby cycle, according to a second embodiment of the invention that realizes a delayed boosted WL level during a Write operation.

FIG. 2E is a timing diagram showing the operation of a memory cell, such as cell 250, according to an embodiment of the invention through a Read cycle, a Write cycle and a Standby cycle, in a second embodiment that realizes a delayed boosted WL level during a Write operation. During the Write operation shown the WL 124 initially rises to a level below VDD, then after a delay sufficient for the establishment of a stable voltage on the BL's 116 of the half addressed cells, WL 124 rises to VDD.

Figure 3A:
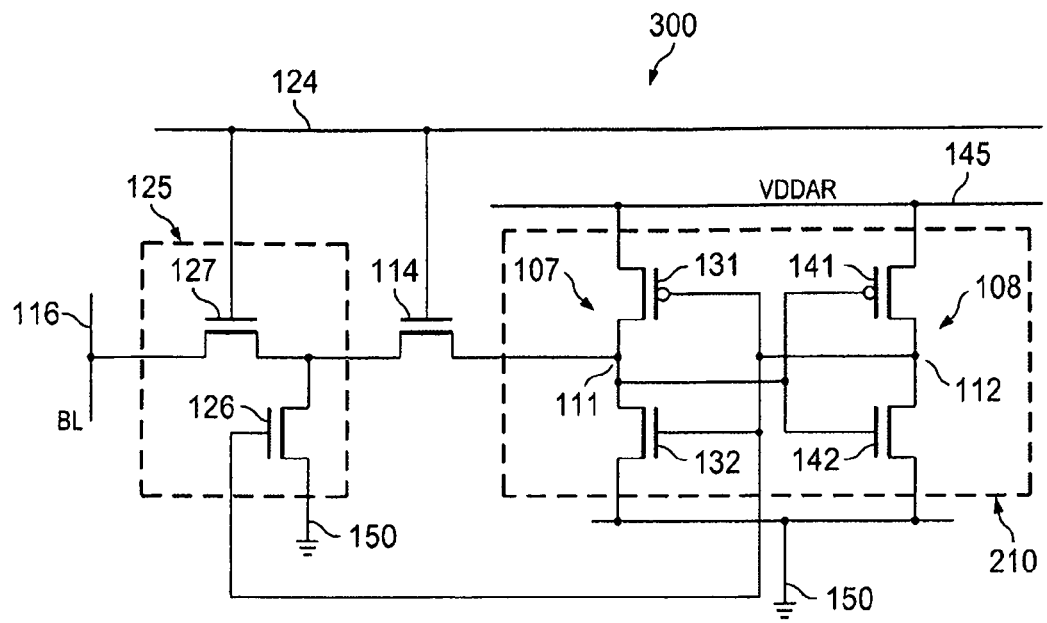
FIG. 3A is a schematic of a 7T cell with a single Read/Write BL and a Read/Write WL, in an alternate topology for improved stability, according to another embodiment of the invention.

FIG. 3A is a schematic of a 7T memory cell 300 with a single Read/Write BL 116, with Read/WL 124, in an alternate topology for generally improved stability, according to another embodiment of the invention. Read/Write BL 116 is now connected to a source/drain of pass gate 127. The other source/drain of pass gate 127 is now connected to the drain of driver 126 and to a source/drain of pass gate 114. For cell 300, the first storage node 111 of core storage element 210 is separated from the BL 116 by both pass gates (127 and 114). This arrangement generally improves SNM but can degrade the robustness of the Write. Such a trade-off may be desirable in certain applications. However, the layout for this configuration is generally not amenable to being as compact as for the cell configuration with the BL 116 at the common node between the two pass gates (127, 114) as shown in FIGS. 2A and 2B.

Figure 3B:
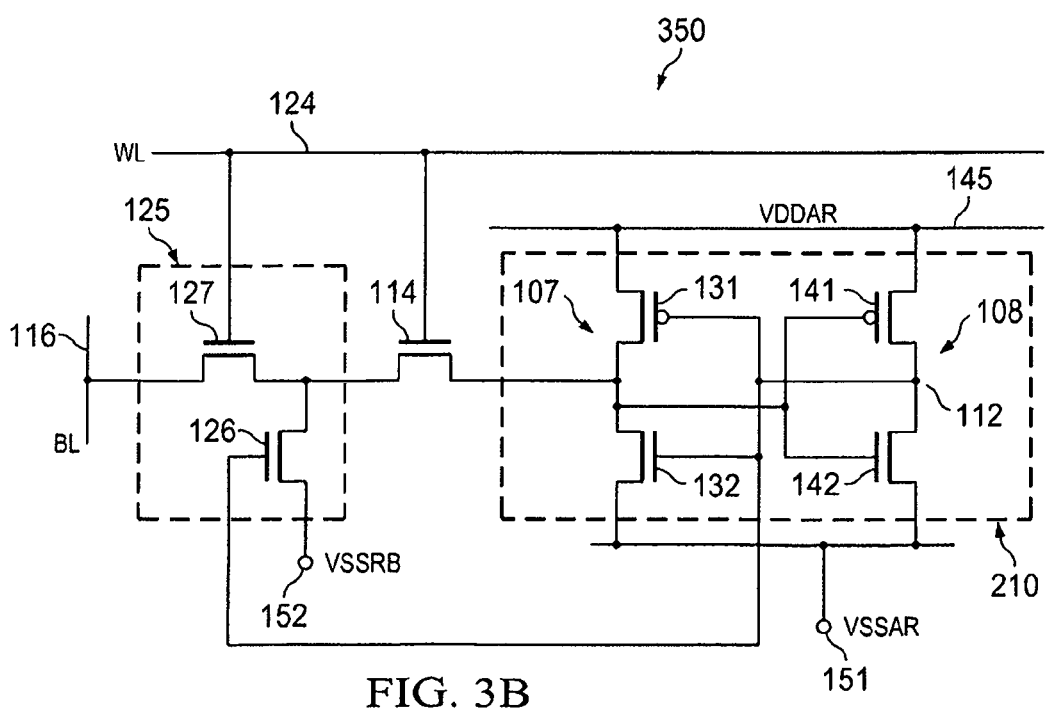
FIG. 3B is schematic of a 7T cell in the alternate topology for improved stability shown in FIG. 3A, having separate VSS power supplies for the core storage element and the buffer circuit, according to an embodiment of the invention.

FIG. 3B is schematic of a 7T memory cell 350 having the alternate topology for improved stability shown in FIG. 3A, having separate VSS power supplies for the core storage element 210 (VSSAR 151) and the buffer circuit 125 (VSSRB 152), according to an embodiment of the invention. A power supply controller, such as power supply controller 174 described below relative to FIG. 6, can be provided to provide variable levels for VSSAR 151, VSSRB 152, and VDDAR 145, optionally selectively by column address.

Figure 4A:
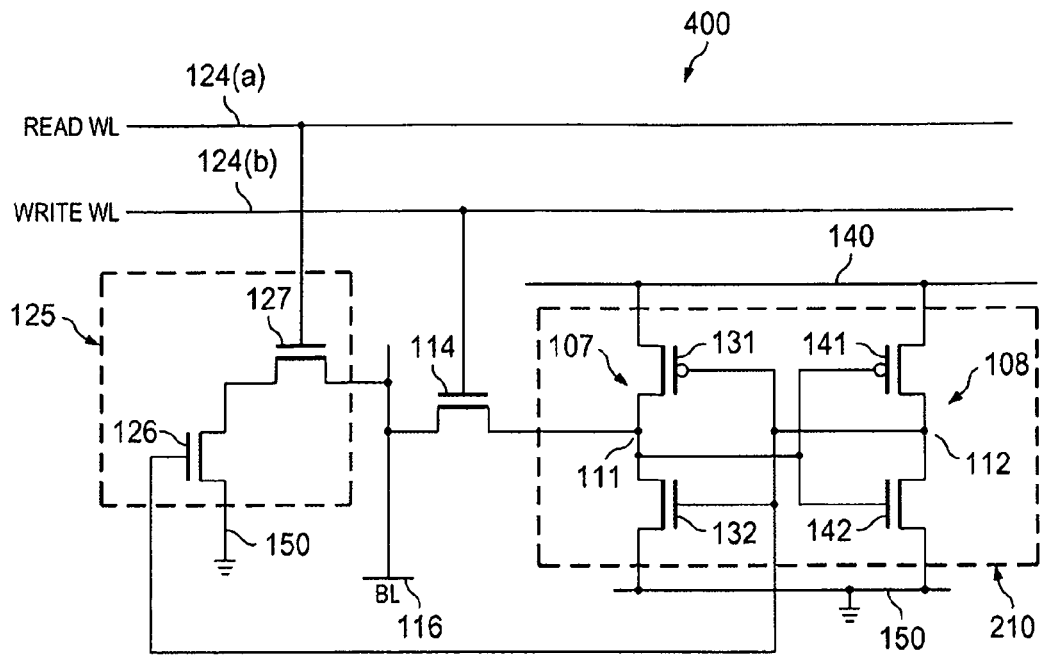
FIG. 4A a schematic of a 7T cell with a single Read/Write BL and separate Read and Write WLs, according to an embodiment of the invention.
Figure 4B:
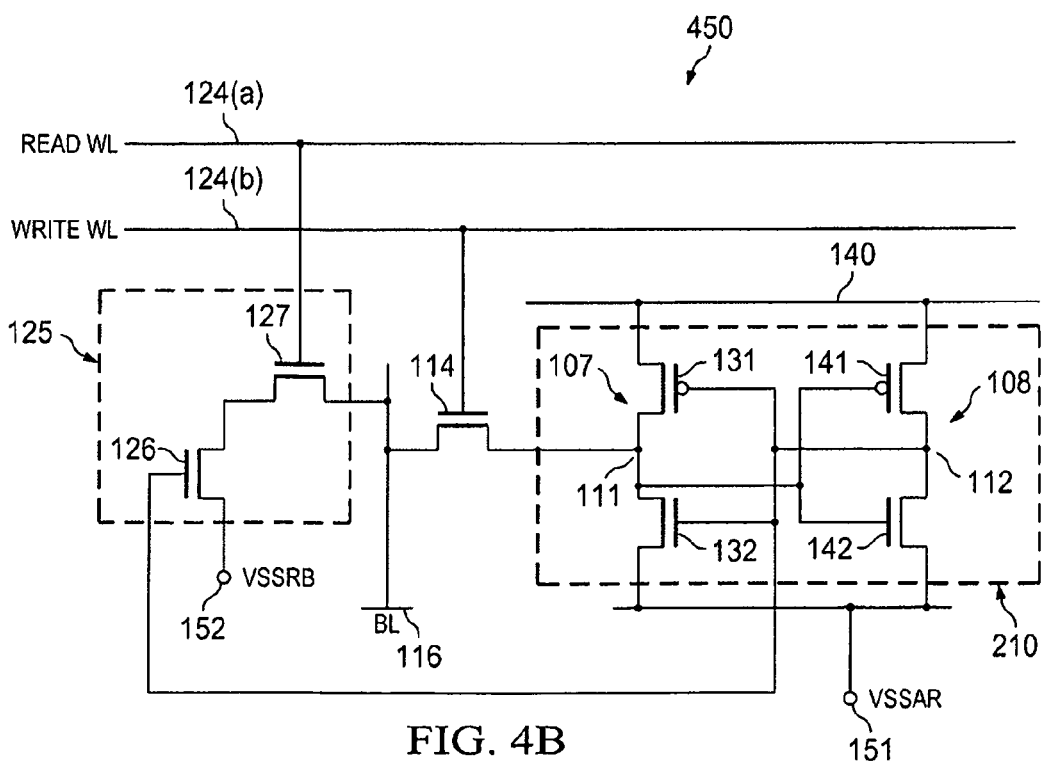
FIG. 4B is schematic of a 7T cell with a single Read/Write BL, with separate Read and Write WLs, having separate VSS power supplies for the core storage element and the buffer circuit, according to an embodiment of the invention.

FIG. 4A a schematic of a 7T cell 400 with a single Read/Write BL 116, with a separate Read WL 124(a) and Write WL 124(b), according to an embodiment of the invention. FIG. 4B is schematic of a 7T memory cell 450 with a Read/Write BL, 116 and separate Read WL 124(a) and Write WL 124(b), having separate VSS power supplies for the core storage element 210 in (VSSAR 151) and the buffer circuit 125 (VSSRB 152), according to an embodiment of the invention. A power supply controller, such as power supply controller 174 shown in FIG. 6, can be provided to provide variable levels, optionally by column, for VSSAR 151, VSSRB 152, and VDD 140.

Figure 4C:
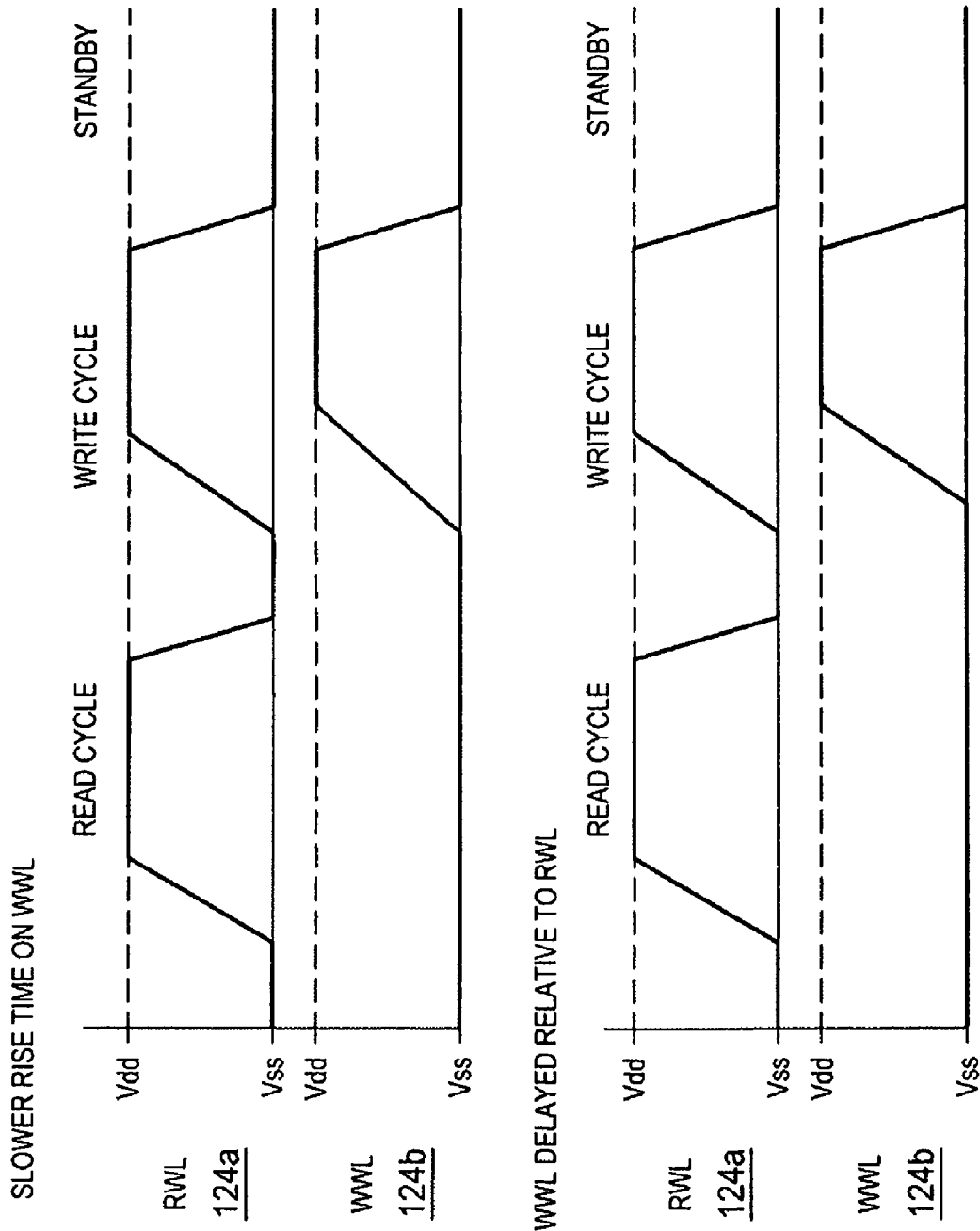
FIG. 4C is a timing diagram showing the operation of a memory cell with a single Read/Write BL and separate Read and Write WLs, such as shown in FIGS. 4A and 4B, through a Read cycle, a Write cycle and a Standby cycle.

FIG. 4C is a timing diagram showing the operation of memory cell 400 or 450 through a Read cycle, a Write cycle and a Standby cycle. Write cycles are shown for both the Write WL 124(b) being slower as compared to the Read WL 124(a), and for the Write WL 124(b) being delayed in time as compared to the Read WL 124(a).

For Read, the Read WL 124(a) is shown asserted, while the Write WL 124(b) is shown not asserted, for both the slower rise time on WWL 124(b) embodiment and the WWL 124(b) delayed relative to the RWL 124(a) embodiment. As a result, there is generally no danger of cell 400 or 450 being upset by BL 116 on Read because the pass gate 114 is off.

For Write, several options exists for operation. A first option is to assert only the Write WL 124(b). Although this is a simple option, there is generally no benefit derived from the buffer circuit 125 for stabilizing the half selected cells during Write. A second option is to assert both the Read WL 124(a) and Write WL 124(b), optionally with the VSS for the buffer circuit 125 floated for the selected columns in the array. This option provides the benefit of the buffer circuit 125 driving the BL's 116 in the half selected cells, reducing the probability of upsetting the half selected cells. Optionally, as shown in the top timing diagram of FIG. 4C, the rise time of WWL 124(b) can be longer as compared to the rise time of RWL 124(a). Alternatively, the assertion of the write WL 124(b) can be delayed relative to assertion of the Read WL 124(a) as shown in the bottom timing diagram of FIG. 4C.

Although not shown, another alternative write option is to first assert the RWL 124(a), then de-assert RWL 124(a), leaving differential on the BL's 116, then assert the WWL 124(b). Optionally there can be some overlap of the WWL 124(b) turning on while the RWL 124(a) is turning off. It is noted that there is generally no need to de-assert the RWL 124(a) if the VSS is floated for the buffer circuit 125 in columns selected for Write as enabled by the cell 450.

Figure 5A:
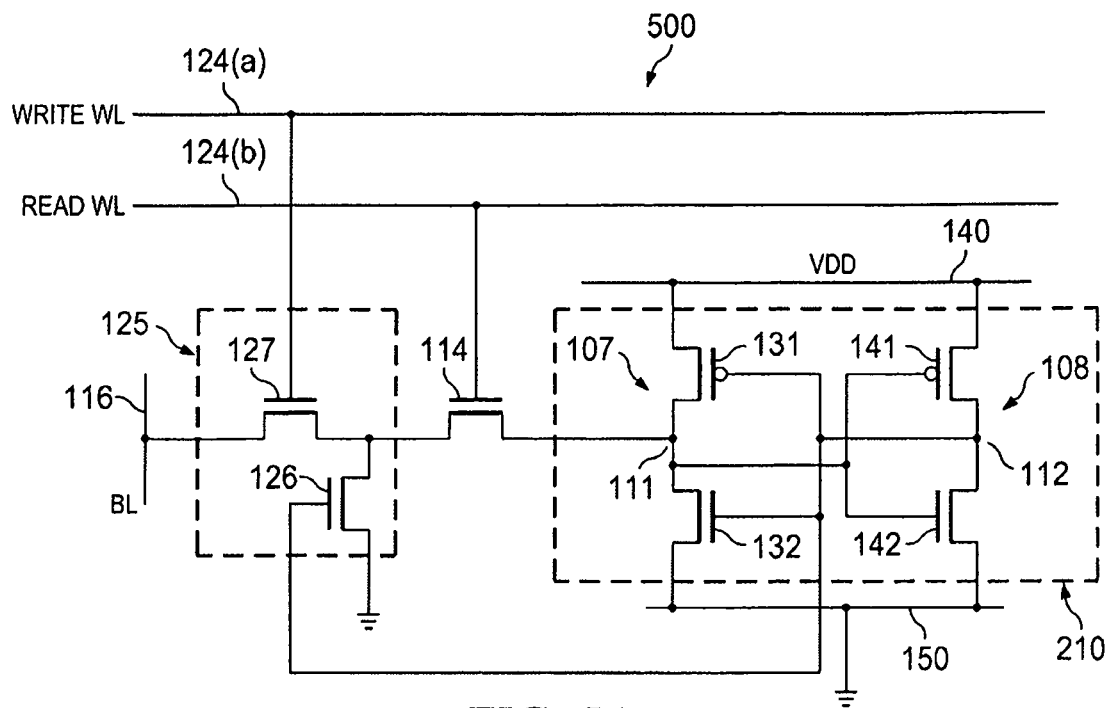
FIG. 5A is a schematic of a 7T cell with a single Read/Write BL, with separate Read and Write WLs, in the alternate topology shown in FIG. 3A for generally improved stability, according to another embodiment of the invention.

FIG. 5A is a schematic of a 7T memory cell 500 with a single Read/Write BL 116, and a separate RWL 124(a) and WWL 124(b), in an alternate topology for improved stability, according to another embodiment of the invention. Analogous to cell 300 shown in FIG. 3A, the Read/Write BL 116 for cell 500 is now connected to the source/drain of pass gate 127, and the source/drain of read gate 127 is now connected to the source/drain of driver 126. Thus, for cell 500, like cell 300, the first storage node 111 of core cell 210 is separated from the BL 116 by both pass gates (127 and 114).

Figure 5B:
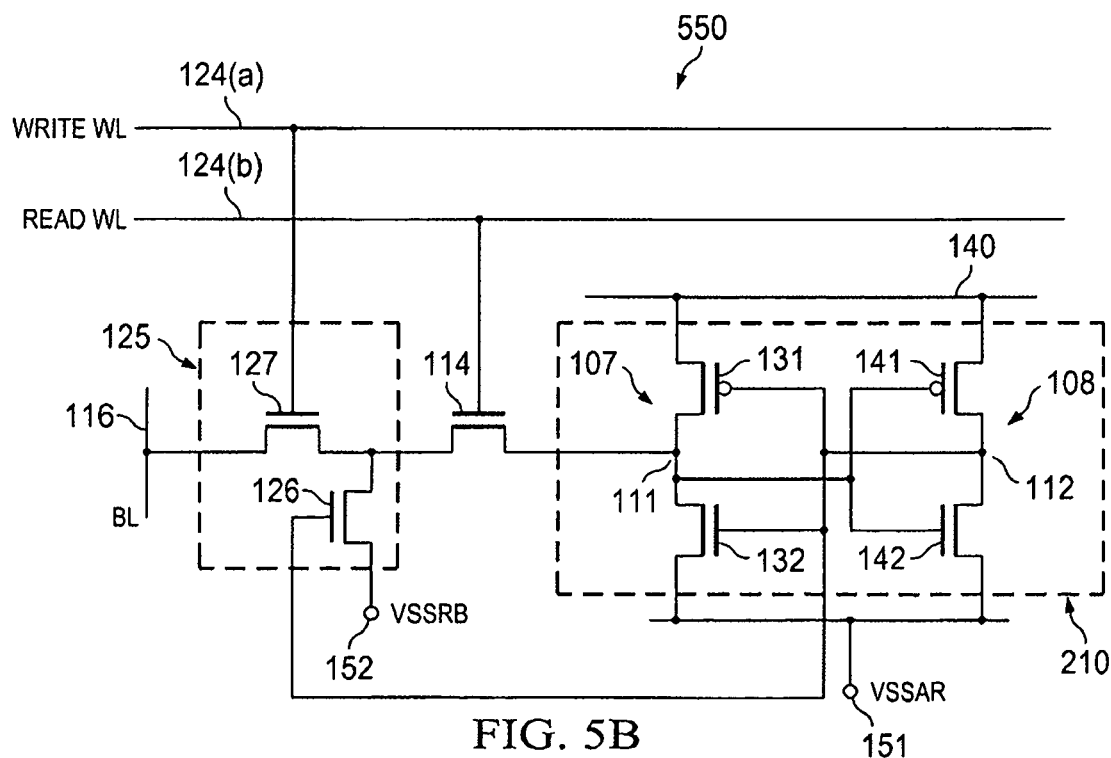
FIG. 5B is a schematic of a 7T cell in the alternate topology for improved stability shown in FIG. 5A, having separate VSS power supplies for the core storage element and the buffer circuit, according to an embodiment of the invention.

FIG. 5B is a schematic of a 7T memory cell 550 in the alternate topology for generally improved stability compared to the memory cell 500 shown in FIG. 5A, with a single Read/Write BL 116, with separate Read WL 124(a) and Write WL 124(b), having separate VSS power supplies for the core storage element 210 (VSSAR 151) and the buffer circuit (VSSRB 152), according to an embodiment of the invention.

Figure 6:
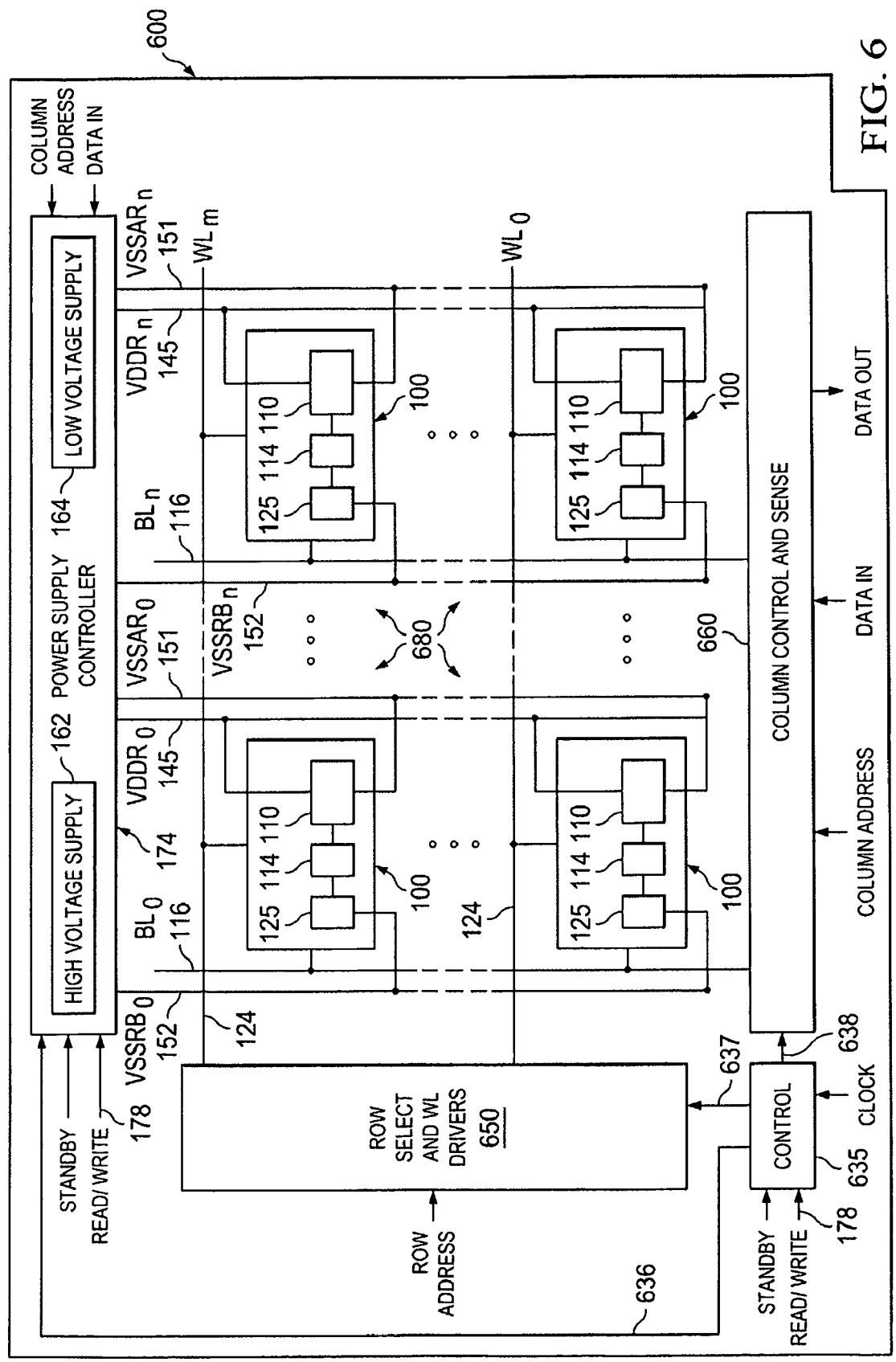
FIG. 6 is a schematic of an integrated circuit comprising a memory array including a plurality of memory cells with a single Read/Write BL for both Reading data from and Writing data to the first storage node, including a power supply controller for providing different supply voltages to the core storage element and the buffer circuit, according to an embodiment of the invention.

FIG. 6 is a schematic of an integrated circuit (IC) 600 comprising a memory array 680 including a plurality of memory cells 100. Memory cells 100 each comprise core storage element 110, pass gate 114, and buffer circuit 125 as described above. IC 600 includes control circuitry 635 that is operable to receive a Read/Write indicator input and a clock signal and output a plurality of control signals 636-638. The Read/Write indicator provides an indication whether a Read or Write operation is to be performed.

The array 680 includes column control and sense circuitry 660 that is operable to receive control signal 638, column address data and other data shown as Data In. Column control and sense circuitry 660 is operable to output data out as well as Read/Write BLs 116 ($BL_0$ ... BLn) per column for both Reading data from and Writing data to the first storage node associated with the core storage element 110 for each cell 100. There is no (second) BL coupled to the second storage node of core storage element 110.

The array 680 also includes row select and WL driver circuitry 650. Row select and WL driver circuitry 650 is operable to receive row address data and control signal 637 and output Read/Write WLs 124 ($WL_0$ ... WLm) per row. It is noted that for the single read/write WL 124 per cell 100 arrangement shown in FIG. 6, the WL select controller portion of row select and WL driver circuitry 650 may not need Read/Write information from Read/Write signal 178. However, Read/Write information from Read/Write signal 178 is generally needed for embodiments of the invention including for designs having separate RWLs and WWLs, and if the WLs 124 are boosted in a Write cycle as described above relative to FIGS. 2D and 2E.

IC 600 includes a power supply controller 174 for providing different supply voltages to the core storage elements 110 and the buffer circuit 125 including separate VSSRB 152 by column in the array so that the VSSRB level can be different for addressed vs unaddressed columns in Write. Power supply controller 174 receives a high supply voltage 162 and low supply voltage 164. For VSS $VSSAR_0$ ... VSSARn 151 is provided for the core storage elements I 10 of the array 680, while $VSSRB_0$ ... VSSRBn 152 is provided for the buffer circuit 125. The levels of VSSAR and VSSRB can be varied by the supply controller 174. As described above, the VSSRB level can be different for addressed vs unaddressed columns in write (see FIG. 2C). Since power supply controller 174 is shown separated from column control and sense circuitry 660, power supply controller 174 is shown also receiving Data In for the option of driving the level of VSSRB 152 according to the data being Written.

As noted above, embodiments of the invention provide several significant advantages. For example, SRAM embodiments of the invention generally provide a better Iread/IDDQ/area trade-off as compared to conventional 6T, 7T, 8T or 10T SRAM cells. For example, embodiments of the invention generally provide a more compact layout compared to conventional 8T or 7T SRAM cell designs. One reason for improved compactness is the reduction of BLs due to the single Read/Write BL aspect of embodiments of the invention, and optionally the Read/Write WL, aspect of the invention. Another reason is that Read and Write-back is no longer generally required, and as a result, the associated peripheral circuitry to sense the RBL and drive the WBL for half selected cells in a Write cycle in conventional 7T SRAM cell comprising circuits is no longer generally required.

Embodiments of the invention also generally provide better stability relative to conventional 7T SRAM cells that as described above have separate Read and Write BL's. For the embodiments of the invention with separate Read and Write WL's (e.g. memory cell 400 shown in FIG. 4A), as described above, the stabilization of unaddressed columns in Write is simpler than the Read-and-Write-back required for conventional designs that have separate Read and Write BL's.

Single-sided Write according to embodiments of the invention is generally advantageous compared to the two-sided (differential) Write generally preferred in the prior art. Related embodiments of the invention can comprises a cell comprising a buffer circuit coupled to a Read/Write BL and the same Read/Write BL coupled to one of the storage nodes of the cell, and a pass gate and second BL coupled to the second storage node. However, in this differential Write arrangement, the improved dynamic stability from the buffer circuit on the single BL described above would not generally be adequate stability protection for the half selected cells in a Write operation. Such cells could be upset by the influence of the second BL.

These are but a few examples. Accordingly, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

I claim:

1. An integrated circuit (IC) including an array of memory cells, each memory cell in said array comprising:
   a core storage element having at least a first storage node, and a first pass gate coupled to said first storage node;
   a single bitline (BL) coupled to said each memory cell, said BL also coupled to a node in a source drain path of said first pass gate; said BL for both Reading data from and Writing data to said first storage node;
   wherein said core storage element includes a complementary second storage node or said cell includes inversion circuitry for outputting an inverted voltage relative to a voltage at said first storage node;
   a buffer circuit comprising a second pass gate and a driver transistor, wherein said second pass gate and said driver transistor are coupled to said source drain path of said first pass gate, wherein said second pass gate is coupled between said BL and said driver transistor, and wherein a gate of said driver transistor is coupled to said second storage node or an output of said inversion circuitry, and
   at least a first wordline (WL) coupled to said first pass gate and said second pass gate.

2. The IC of claim 1, wherein said first and said second pass gates are connected in series between said core storage element and said driver transistor, and said BL is coupled between said first and said second pass gates.

3. The IC of claim 1, wherein said first and said second pass gates are connected in series between said core storage element and said BL, and said first pass gate is coupled between said driver transistor and said first storage node.

4. The IC of claim 1, wherein said storage element comprises cross coupled first and second inverters, wherein said first inverter provides said first storage node and said second inverter provides said second storage node.

5. The IC of claim 1, wherein said first and second pass gates are both controlled by said first WL.

6. An integrated circuit (IC) including an array of memory cells, each memory cell in said array comprising:
   a core storage element having at least a first storage node, and a first pass gate coupled to said first storage node;
   a single bitline (BL) coupled to a node in a source drain path of said first pass gate; said BL for both Reading data from and Writing data to said first storage node;
   wherein said core storage element includes a complementary second storage node or said cell includes inversion circuitry for outputting an inverted voltage relative to a voltage at said first storage node;
   a buffer circuit comprising a second pass gate and a driver transistor, wherein said second pass gate and said driver transistor are coupled to said source drain path of said first pass gate, wherein said second pass transistor is coupled between said BL and said driver transistor, and wherein a gate of said driver transistor is coupled to said second storage node or an output of said inversion circuitry,
   a first wordline (WL) coupled to said first pass gate; and
   a second WL coupled to said second pass gate, wherein said second pass gate is controlled by said second WL.

7. The IC of claim 1, wherein an average threshold voltage for said second pass gate in said each memory cell in said array is $\geq 20$ mv lower as compared to an average threshold voltage of said first pass gate in said each memory cell in said array.

8. The IC of claim 1, wherein said integrated circuit comprises separate VSS supply lines operable for supplying different VSS levels for said core storage elements and said buffer circuit.

9. The IC of claim 8, further comprising a power supply controller having a plurality of outputs for coupling to each of said separate VSS supply lines.

10. An integrated circuit (IC) including an array of SRAM memory cells, each memory cell in said SRAM comprising:
    a core SRAM storage element comprising first and second cross-coupled inverters, said first inverter having a first storage node and said second inverter having a second storage node,
    a first pass gate coupled to said first storage node;
    a single bitline (BL) coupled to said each memory cell, said BL also coupled to a node in a source drain path of said first pass gate, said BL for both Reading data from and Writing data to said first storage node;
    a buffer circuit comprising a second pass gate and a driver transistor, wherein said second pass gate and said driver transistor are coupled to said source drain path of said first pass gate, wherein said second pass transistor is coupled between said BL and said driver transistor, and wherein a gate of said driver transistor is coupled to said second storage node, and
    at least a first wordline (WL) coupled to said first pass gate and said second pass gate.

11. The IC of claim 10, wherein said first and said second pass gates are connected in series between said core storage element and said driver transistor, and said BL is coupled between said first and said second pass gates.

12. The IC of claim 10, wherein said first and said second pass gates are connected in series between said core storage element and said BL, and said first pass gate is coupled between said driver and said storage element.

13. The IC of claim 10, wherein said first and second pass gates are both controlled by said first WL.

14. An integrated circuit (IC) including an array of SRAM memory cells, each memory cell in said SRAM comprising:
- a core SRAM storage element comprising first and second cross-coupled inverters, said first inverter having a first storage node and said second inverter having a second storage node,
- a first pass gate coupled to said first storage node;
- a single bitline (BL) coupled to a node in a source drain path of said first pass gate, said BL for both Reading data from and Writing data to said first storage node;
- a buffer circuit comprising a second pass gate and a driver transistor, wherein said second pass gate and said driver transistor are coupled to said source drain path of said first pass gate, wherein said second pass transistor is coupled between said BL and said driver transistor, and wherein a gate of said driver transistor is coupled to said second storage node, and
- a first wordline (WL) coupled to said first pass gate; and
- a second WL coupled to said second pass gate, wherein said second pass gate is controlled by said second WL.

15. A method of operating a memory array comprising a plurality of memory cells, each memory cell in said array comprising a core storage element having at least a first storage node, a first pass gate coupled to said first storage node, and a buffer circuit comprising a second pass gate and a driver transistor coupled to a source drain path of said first pass gate, a single bitline (BL) coupled to said each memory cell, said BL also coupled to a node in said source drain path of said first pass gate for both Reading data from and Writing data to said first storage node, wherein said second pass gate is coupled between said BL and said driver transistor, and at least a first wordline (WL) coupled to said first pass gate and said second pass gate,
said method comprising modifying a signal level on said BL with said buffer circuit during at least one operation of said memory cell.

16. A method of operating a memory array comprising a plurality of memory cells, each memory cell in said array comprising a core storage element having at least a first storage node, a first pass gate coupled to said first storage node, and a buffer circuit comprising a second pass gate and a driver transistor coupled to a source drain path of said first pass gate, a single bitline (BL) coupled to a node in said source drain path of said first pass gate for both Reading data from and Writing data to said first storage node, wherein said second pass gate is coupled between said BL and said driver transistor, and a first wordline (WL) is coupled to a gate of said first pass gate plus a second WL is coupled to a gate of said second pass gate, further comprising during a Write operation asserting said first and said second WL, wherein a slower rise time signal is applied to said first WL as compared to a rise time of a signal applied to said second WL.

17. A method of operating a memory array comprising a plurality of memory cells, each memory cell in said array comprising a core storage element having at least a first storage node, a first pass gate coupled to said first storage node, and a buffer circuit comprising a second pass gate and a driver transistor coupled to a source drain path of said first pass gate, a single bitline (BL) coupled to a node in said source drain path of said first pass gate for both Reading data from and Writing data to said first storage node, wherein said second pass gate is coupled between said BL and said driver transistor, and a first wordline (WL) is coupled to a gate of said first pass gate plus a second WL is coupled to a gate of said second pass gate, further comprising during a Write operation asserting said second WL before said first WL.

18. The method of claim 15, wherein said first WL is coupled to both a gate of said first pass gate and a gate of said second pass gate, further comprising during a Write operation said first WL transitioning initially to a first voltage level and later during said Write operation transitioning to a second voltage level that is a higher as compared to said first voltage level.

19. The method of claim 15, wherein each of said memory cells further comprise a second WL, wherein said first WL is coupled to a gate of said first pass gate and said second WL is coupled to a gate of said second pass gate, further comprising during a Read operation asserting said second WL while not asserting said first WL.

20. The method of claim 15, further comprising the step of applying a different supply voltage to said storage element as compared to said buffer circuit during at least one operation of said memory cell.

21. The method of claim 15, further comprising the step of floating a VSS power supply line coupled to a source of said driver while said memory cells are in Standby.

22. The method of claim 15, further comprising the step of floating or raising a VSS power supply line level coupled to a source of said driver for addressed columns of said memory cells in said array during a Write operation.

23. The method of claim 15, further comprising the step of lowering a VDD level on a supply line coupled to said core storage elements in addressed columns of said memory cells in said array during a Write operation.

* * * * *